United States Patent
Boles et al.

(10) Patent No.: US 6,559,024 B1
(45) Date of Patent: May 6, 2003

(54) METHOD OF FABRICATING A VARIABLE CAPACITY DIODE HAVING A HYPERABRUPT JUNCTION PROFILE

(75) Inventors: Timothy Edward Boles, Tyngsboro, MA (US); Joel Lee Goodrich, Westford, MA (US); Thomas Robert Lally, North Reading, MA (US); James Garfield Loring, Jr., Hudson, NH (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 09/538,115

(22) Filed: Mar. 29, 2000

(51) Int. Cl.[7] .............................................. H01L 29/93
(52) U.S. Cl. ..................... 438/379; 438/397; 438/48; 257/528; 257/52
(58) Field of Search .................... 257/368, 52, 471, 257/528, 798, 275; 357/15, 41, 219.1; 333/247, 246, 239, 33, 164, 32, 23, 20; 365/175; 438/379, 522, 397, 254, 52, 745, 48, 50, 53

(56) References Cited

U.S. PATENT DOCUMENTS

| | | | |
|---|---|---|---|
| 3,638,300 A | | 2/1972 | Foxhall et al. ................. 29/589 |
| H29 H | * | 3/1986 | Christou, et al. ............. 357/13 |
| 5,014,018 A | * | 5/1991 | Rodwell et al. ............... 333/20 |
| 5,256,579 A | * | 10/1993 | Lezec et al. .................. 438/522 |
| 5,256,996 A | * | 10/1993 | Marsland et al. ............. 333/20 |
| 5,293,050 A | * | 3/1994 | Chapple-Sokol et al. ..... 257/17 |
| 5,298,452 A | | 3/1994 | Meyerson ..................... 437/81 |
| 5,352,994 A | * | 10/1994 | Black et al. .................. 333/33 |
| 5,367,020 A | * | 11/1994 | Kobayashi et al. ........... 525/64 |
| 5,378,939 A | * | 1/1995 | Marsland et al. ............ 307/352 |
| 5,378,989 A | * | 1/1995 | Barber et al. ................ 324/318 |
| 5,496,755 A | * | 3/1996 | Bayraktaroglu .............. 438/167 |
| 5,506,442 A | | 4/1996 | Takemura .................... 257/597 |
| 5,684,737 A | * | 11/1997 | Wang et al. ................. 365/175 |
| 5,915,187 A | | 6/1999 | Huisman et al. ............. 438/379 |
| 6,228,734 B1 | * | 5/2001 | Bliss et al. .................. 438/379 |
| 6,355,534 B1 | * | 3/2002 | Cheng et al. ................ 438/379 |

FOREIGN PATENT DOCUMENTS

| | | | | |
|---|---|---|---|---|
| EP | 1139434 | * | 4/2001 | .................... 29/93 |
| JP | 404062977 | * | 2/1992 | .................... 29/93 |

* cited by examiner

*Primary Examiner*—Carl Whitehead, Jr.
*Assistant Examiner*—Laura M Schillinger

(57) ABSTRACT

A method of fabricating a hyperabrupt junction varactor diode structure comprises the steps of forming a non-uniformly doped n-type, hyperabrupt cathode region in a layer of semiconductor material and depositing, by ultra high vacuum chemical vapor deposition (UHVCVD), a p-type anode region onto a surface of the hyperabrupt cathode region. The deposition process is performed at relatively low temperature (i.e., below 600° C.). The anode region and the hyperabrupt cathode are joined at a junction between them such that an impurity concentration level of the hyperabrupt region increases in a direction toward the junction. During the forming step, n-type impurity ions are implanted at an implantation energy level substantially less than 300 keV, preferably between from about 10 to about 70 keV, with the implanted ions being thermally activated at a relatively low temperature (between from about 700 to about 800° C.).

27 Claims, 5 Drawing Sheets

METHOD OF FABRICATING A VARIABLE CAPACITY DIODE HAVING A HYPERABRUPT JUNCTION PROFILE

BACKGROUND OF THE INVENTION

1. Field of the Invention

The present invention relates generally to varactor diodes and, more particularly, to a method of forming a varactor diode having a hyperabrupt junction profile.

2. Description of the Related Art

In a semiconductor, charge carriers (electrons or holes) diffuse from a high carrier-density region to a low carrier-density region. For this reason, charge carriers diffuse across the junction of an unbiased semiconductor diode to create a depletion region of ionized atoms, i.e., atoms which have lost their mobile carriers. Once this built-in potential $V_{bi}$ has been established by the initial diffusion, it acts as a barrier to further diffusion.

If a reverse bias is imposed across the diode, the depletion region widens to expose a region of negative charges (due to acceptor atoms) on one side of the junction and a region of positive charges (due to donor atoms) on the other. The width of the depletion region is a function of the impurity doping levels of the diode junction. For example, if both sides of the junction are equally doped, the depletion region will extend an equal distance from the junction. With unequal doping levels, the depletion region will extend farther into the side which has the smaller impurity concentration.

The electric field is found by integrating the negative and positive charges. In contrast, the potential drop across the junction is found by a second charge integration or, equivalently, an integration of the electric field. If the doping concentration is constant, the electric field in the depletion region peaks at the junction and decreases linearly to the edges of the depletion region. In this case, the potential drop across the depletion region has a quadratic form.

If the reverse bias is increased to a breakdown voltage $V_{BR}$, a large reverse current results because the electric field at the junction exceeds the dielectric strength of the diode's semiconductor material. Covalent atomic bonds are ruptured, a large number of minority carriers are released and the diode is said to avalanche. The electric field and potential drop of depletion regions has been discussed by many authors (e.g., Singh, Jasprit., Semiconductor Devices, McGraw-Hill, Inc., New York, 1994, pp. 192–208). In contrast with diodes that are purposely intended to operate in breakdown, varactor diodes are generally configured to avoid breakdown over an operational reverse-bias range.

In a varactor diode, each side of the diode junction is conductive and the depletion region acts as a dielectric so that a reverse-biased semiconductor junction has the structure of a capacitor, i.e., two conducting regions separated by a dielectric. The capacitance depends directly on the junction area and inversely on the width of the depletion region, i.e., $C=(\in A)/d$ in which c is the dielectric constant, A is the junction's cross-sectional area and d is the width of the depletion region. The diode capacitance decreases with increased reverse bias because this change in bias causes the depletion width to increase. The capacitance ratio over a specified reverse bias range is generally referred to as the tuning ratio.

Varactors find utility in a variety of electronic circuits. For example, a varactor diode in a resonant circuit can control the frequency of a voltage-controlled oscillator (VCO) or the amplifier frequency in a receiver. Typically, VCOs and receiver amplifiers are tuned smoothly across their operating bands. Varactor diodes for these applications usually exhibit a junction capacitance that is proportional to an exponential power of the reverse-bias voltage $V_r$, e.g., C varies as $(1/V_r)^{1/2}$. Abrupt-junction varactor diodes have uniform doping on each side of the junction with an abrupt transition at the junction. It will be appreciated from the aforementioned inverse square root relationship, as the applied voltage is increased by a factor of 4, the junction capacitance in an abrupt junction varactor diode will decrease by a factor of 2:1. Another way of expressing this relationship is that over the range of 1 to 4 volts, the capacitance-tuning ratio of an abrupt junction varactor diode is 2:1.

As more and more applications have been identified which require either faster tuning/frequency hopping speeds or low voltage operation, recent emphasis has been placed on the finding ways to increase the tuning ratios of varactor diodes so as to enable larger swings of capacitance or reactance with the same or reduced applied voltages. Such emphasis has culminated in the development of so-called hyperabrupt junction varactor diodes. In a conventional hyperabrupt-junction diode, the doping level increases as the junction is approached from either side, yielding an exponential relationship in which C varies as $(1/(V_r+h)^k$, in which $V_r$ is the biasing voltage, h is the height of the Schottky barrier, the parameter k defines the doping variation as a function of the distance with respect to the surface. Thus, as opposed to the abrupt junction case described above where the exponent k is exactly equal to one-half, a hyperabrupt profile is obtained when the exponent k is greater than ½.

In FIG. 1A, there is shown one type of conventional hyperabrupt junction varactor diode generally indicated at 10 and comprising a cathode defined by an epitaxial layer 14 of semiconductor material (e.g., Si or GaAs) doped N type on an N+ substrate 12. A variably doped hyperabrupt region 16 is defined beneath an anode region 18, the latter being provided with an ohmic contact 20 of, for example, PtSi, to an overlying anode metalization layer 22.

While the conventional structure depicted in FIG. 1A is capable of producing hyperabrupt varactor diodes having capacitance-voltage tuning ratios of up to 12:1, these structures have demonstrated a high degree of variability on both a unit-to-unit and a lot-to-lot basis—even from the same vendor. Moreover, it has proved difficult to move past a tuning factor of 12:1. The capacitance-voltage response of a conventional hyperabrupt varactor structure, as exemplified by FIG. 1A, is depicted in FIG. 1B. For purposes of comparison, the capacitance voltage response of a conventional varactor is also shown in FIG. 1B.

The inventors herein are the first to appreciate that the aforementioned limitations in repeatability and tuning ratio are directly attributable to the processes which have heretofore been employed in the fabrication of hyperabrupt structures. Returning briefly to the conventional structure shown in FIG. 1A, it will be recalled that the variably doped hyperabrupt cathode region 16 directly underlies the anode region 18. In the illustrative structure of FIG. 1, the hyperabrupt region 16 is N-type while the anode is P-type. High energy ion implantation of phosphorous, either singly or multiply charged, is the generally accepted mode of creating hyperabrupt region 16 in the N-type cathode layer 14. By way of illustrative example, this ion implantation may be accomplished either through the already existing P+ anode region 18 or, alternatively, directly into the cathode layer 14 with a subsequent P+ implant or diffusion to form the anode structure. In either case, the implantation of hyperabrupt region 16 must generally be performed at very high energy levels—either on the order of 150 keV to 350 keV in conjunction with multiply charged phosphorous ions (P$^{++}$) to result in an effective singly charged level of 300 keV to 700 keV, or substantially higher implantation energy levels using a MeV implanter with single charged phosphorous ions. The implant(s), either the hyperabrupt cathode implant region 16 alone or in conjunction with the anode implant region 18, are then thermally activated via a furnace or a Rapid Thermal Annealing (RTA) heat cycle. The resulting hyperabrupt doping profile typically realized in the exemplary structure of FIG. 1A is depicted in FIG. 1C.

A principal disadvantage associated with both of the aforementioned techniques for defining the hyperabrupt region resides in the half-width of the Gaussian implant profile. Having a junction in depth, it has heretofore been impossible to satisfactorily form a high ratio hyperabrupt profile by implantation because the exponent k depends on the Gaussian distribution of the implantation used. Unfortunately, the higher the energy or effective energy, the larger the standard deviation of the ion scatter and the more graded the corresponding N-type hyperabrupt region.

An additional source of undesirable variation in the doping profile of the hyperabrupt region 16 is the high temperature heat cycle (typically 900–1100° C.) associated with the electrical activation of the implanted cathode and anode regions 16 and 18. The high temperatures to which the structure is subjected causes the dopants to become substitutional rather than interstitial in the lattice, thereby promoting solid state diffusion and, ultimately, leading to a further flattening of and greater variability in the resultant junction profiles. Lastly, the simultaneous diffusion of the P+ anode 18 and the N-type hyperabrupt region 16 adversely affects the control of the doping concentration at their interface. It is difficult enough to control this crossing point of two exponential functions without adding the variation introduced by the unwanted diffusion of the ion implantation regions.

SUMMARY OF THE INVENTION

The aforementioned deficiencies are addressed, and an advance is made in the art, by a hyperabrupt junction varactor diode structure which comprises a cathode formed by a substrate of n-type semiconductor material having an epitaxial layer of n-type semiconductor material disposed thereon. The structure further includes an anode formed by deposition of a layer of strongly doped p-type semiconductor material onto a surface of the epitaxial layer, the anode being thereby joined to the cathode at a junction between them. The cathode further includes a non-uniformly doped n-type hyperabrupt region that extends from the junction into the epitaxial layer. The impurity concentration level of the hyperabrupt region increases in a direction toward the junction.

The non-uniformly doped hyperabrupt region is defined directly within the epitaxial layer of n-type semiconductor material. In accordance with a preferred embodiment of the present invention, this is achieved by a relatively low energy (i.e., on the order of 10–70 keV) singly charged ion implantation followed by a low temperature thermal activation step via, for example, rapid thermal annealing at a temperature that is preferably between from about 700° to 800° C.

In accordance with an especially preferred embodiment of the present invention, the p-type semiconductor material is grown epitaxially over the hyperabrupt region by UHVCVD—at a temperature that is preferably below 600° C. Epitaxial growth at such low temperatures avoids, or at least minimizes, diffusion of the anode material or atoms thereof into or through the hyperabrupt implanted region.

BRIEF DESCRIPTION OF THE DRAWINGS

For a better understanding of the various features, aspects and advantages which characterize the invention described and claimed herein, reference may be had to the detailed description which follows taken in conjunction with the accompanying drawings, in which:

DETAILED DESCRIPTION OF THE INVENTION

Figure 2:
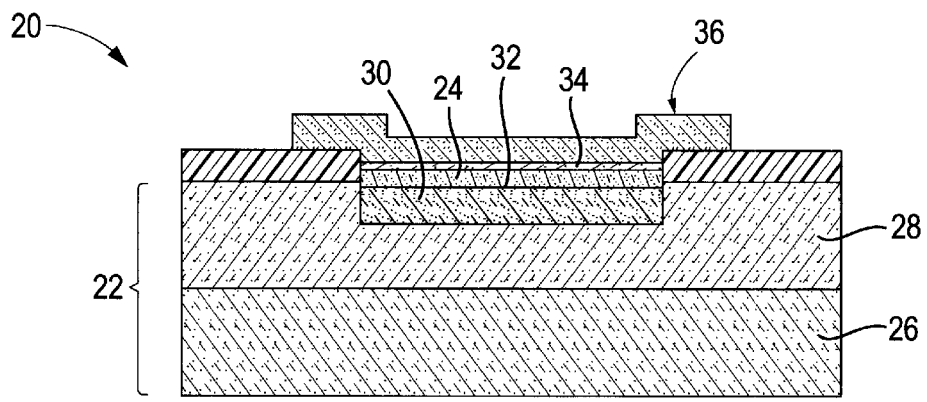
FIG. 2 is a cross sectional view of a planar hyperabrupt junction varactor diode constructed in accordance with an illustrative embodiment of the present invention.

As shown in the drawings, and in particular FIG. 2, a hyperabrupt junction varactor diode structure 20 according to an illustrative embodiment of the present invention includes a cathode portion 22 and an anode portion 24. Cathode portion 22 comprises a substrate of semiconductor material 26. The substrate, which may illustratively be Si, is n+ heavily doped to, for example, a typical impurity concentration of $1 \times 10^{19}$ atoms/cm$^3$. For this purpose, a suitable n-type dopant such as phosphorous, arsenic or antimony, for example, may be used. Cathode portion 22 further includes an n-type epitaxial layer 28 of semiconductor material doped to an impurity concentration of, by way of example, $5 \times 10^{14}$ to $5 \times 10^{16}$ atoms/cm$^3$, which layer is grown directly on a surface of substrate 26.

With continued reference to FIG. 2, it will be seen that within epitaxial layer 28, there is defined a region 30 having a graduated n-type impurity concentration so as to obtain a desired hyperabrupt profile. In accordance with an especially preferred embodiment of the present invention, the region 30 is obtained by a relatively low energy (approximately 10 keV to 70 keV, for example) implantation of, by way of illustration, singly charged phosphorous (P$^+$) ions. Dramatic results are therein obtained when compared to prior art structures in which the hyperabrupt region is defined using a high energy (300 to 700 keV equivalent) implantation technique. The inventors herein have observed, in fact, that a hyperabrupt region 30 formed in accordance with the present invention achieves a reduction in the half-width of the implanted profile. Also attributable to a low energy implantation is a concomitant reduction in the associated standard deviation of the scatter—by a factor of 4.4 to 6.1 times—so that the gradient of the hyperabrupt region is much steeper.

Figure 4:
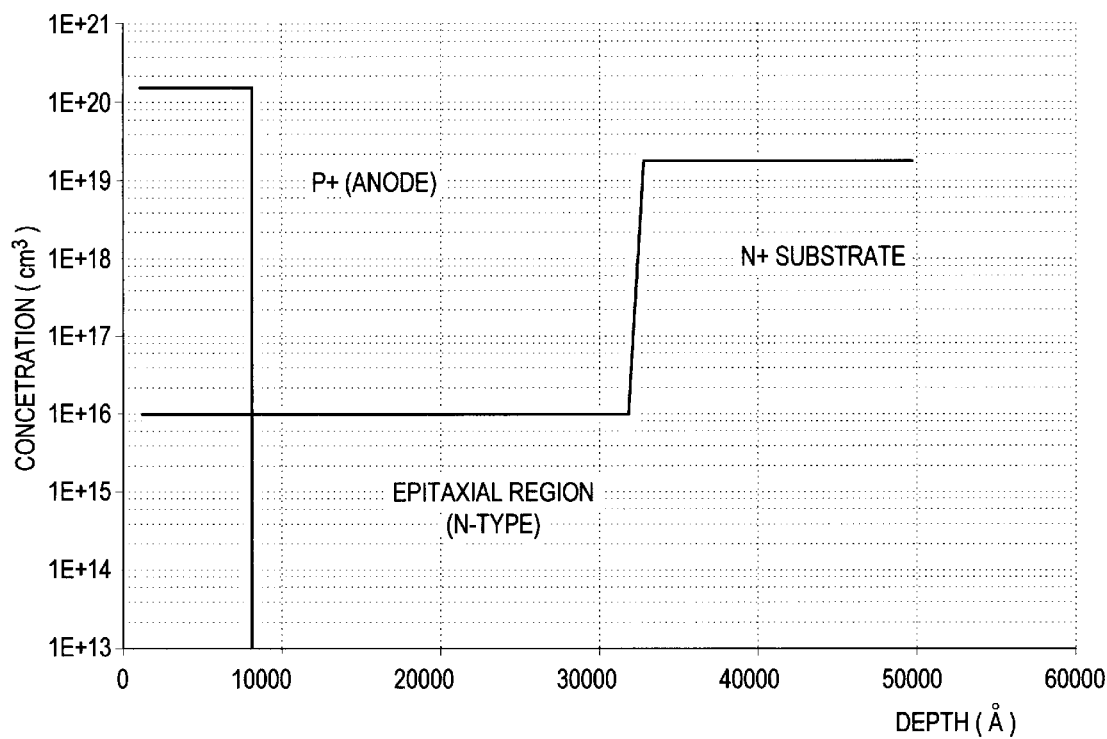
FIG. 4 depicts an exemplary doping profile for the illustrative hyperabrupt junction varactor diode structure of FIG. 2G.

As will be readily ascertained by those skilled in the art and as best seen in FIG. 4, the concentration of impurities in the low energy hyperabrupt implant region 30 of cathode 22 rises in the direction away form substrate and toward the junction 32 between region 30 and anode 24. In accordance with the illustrative doping profile shown in FIG. 4, in which the thickness of epitaxial layer 28 is between about 0.5 and about 7 nm and the thickness of implant region 20 is between from about 0.1 microns to about 0.5 microns, the impurity level in hyperabrupt implant 30 increases linearly from about $5 \times 10^{14}$ to about $5 \times 10^{16}$ atoms/cm$^3$ at interface 32 with epitaxial layer 209 to a peak concentration, say, in excess of $1 \times 10^{17}$ atoms/cm$^3$.

The low energy implantation that forms the implant region 30 is then thermally activated—preferably at a temperature of between from about 700 to about 800° C. to avoid unwanted diffusion.

In accordance with another aspect of the present invention, the anode 24 is formed by depositing a strongly doped P$^+$ layer of semiconductor material via a suitable technique such, for example, as ultra high vacuum chemical vapor deposition (UHVCVD) epitaxy, this deposition being performed at temperatures sufficiently low as to avoid diffusion of the anode material into or through the hyperabrupt implant region. In that regard, the inventors herein have obtained excellent results by employing temperatures at or below 600° C. during the growth of anode 24.

It is believed that the UHVCVD process, as applied to the growth of the device layers contemplated by the inventors herein, is well understood by those skilled in the art. Although a detailed description of the same has therefore been omitted in the interest of clarity, reference may be had to U.S. Pat. No. 5,298,452 entitled "METHOD AND APPARATUS FOR LOW TEMPERATURE, LOW PRESSURE CHEMICAL VAPOR DEPOSITION OF EPITAXIAL SILICON LAYERS" and issued to Meyerson et al. on Mar. 29, 1994, for a detailed description thereof.

In any event, and with reference now to FIG. 4, the illustrative embodiment of FIG. 2 may be configured with an impurity concentration of between $1 \times 10^{18}$ and $1 \times 10^{20}$ atoms/cm$^3$ using a conventional p-type dopant such, for example, as boron. Advantageously, the low temperature growth of the anode 24 permits the concentration at the anode/hyperabrupt cathode junction or interface 32 to be precisely controlled. An ohmic contact 34 of, for example, sintered PtSi, is provided over the anode 24, whereupon a suitable metalization 36 of, illustratively, TiPtAu may be deposited thereon to accommodate application of a bias voltage to the resulting varactor structure.

Figure 1A:
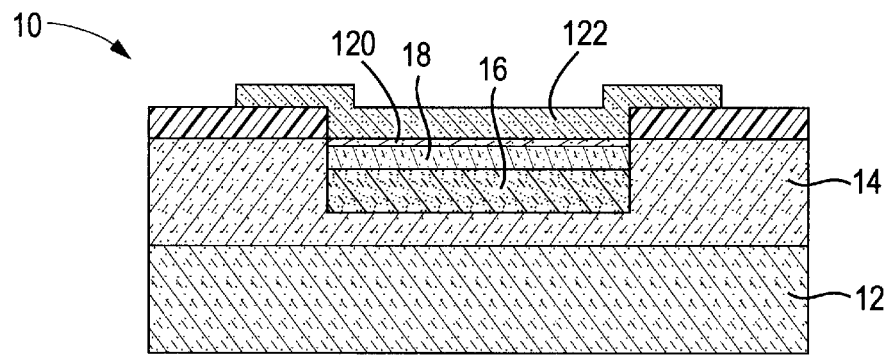
FIG. 1A is a diagram of a conventional hyperabrupt Junction varactor structure.
Figure 5:
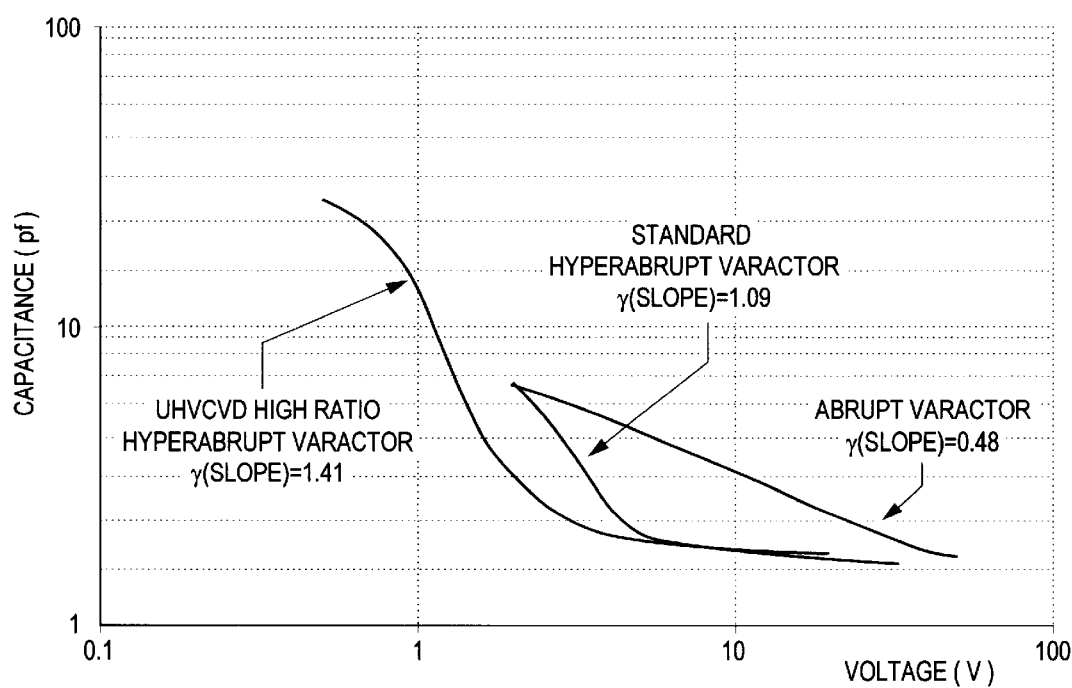
FIG. 5 is a graphical representation comparing the capacitance/bias voltage characteristics of a hyperabrupt varactor diode constructed in accordance with the present invention with both a conventional abrupt and a conventional hyperabrupt varactor diode.

As can be seen in FIG. 5, hyperabrupt varactor structures constructed in accordance with the present invention offer substantial improvements over those of the prior art in terms of the capacitance tuning ratio. Specifically, the present invention not only allows a 12:1 tuning ratio to be reliably and consistently reproduced, but it has also enabled diodes having a tuning ratio in excess of 15:1 to be achieved. In addition, by virtually elimination the unwanted diffusion of the anode and cathode profiles, the variation of the tuning characteristics have been reduced from an observed 20% with the prior structure of FIG. 1A to approximately 1% with the subject invention.

Figure 3A:
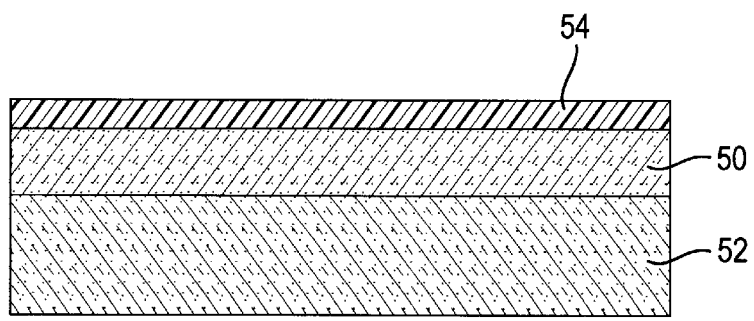
FIGS. 3A–3G depict the various stages of fabrication of a hyperabrupt junction varactor diode structure constructed in accordance with the teachings of the present invention.
Figure 1B:
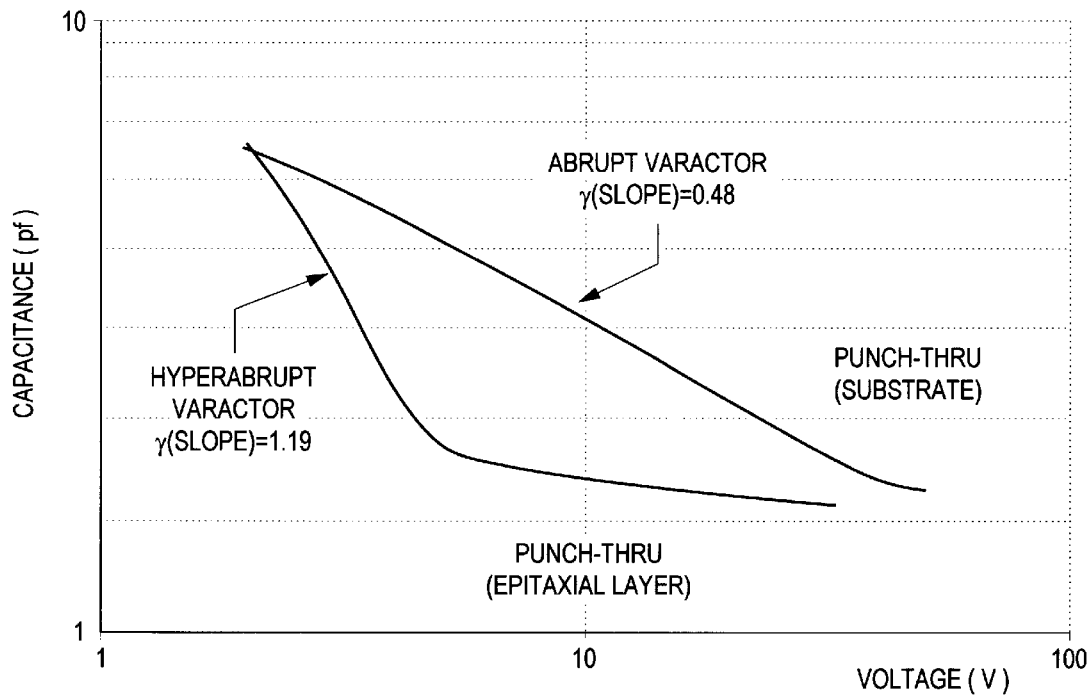
FIG. 1B is a graphical representation of the capacitance voltage response exhibited by both the conventional hyperabrupt junction varactor structure of FIG. 1A and a conventional abrupt-junction varactor.
Figure 1C:
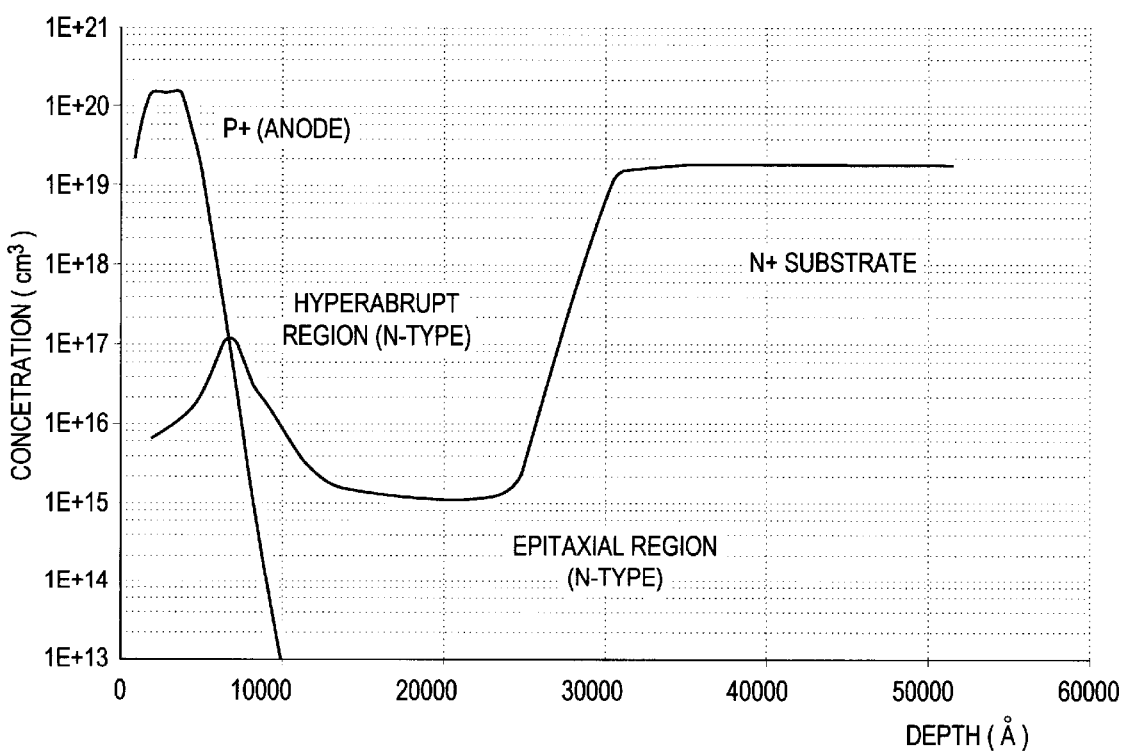
FIG. 1C is a graphical representation of the doping profile of the respective regions of the conventional hyperabrupt varactor structure of FIG. 1A.

With particular reference now to FIGS. 3A–3G, an illustrative technique by which the inventive structure of FIG. 2 may be fabricated so as to exhibit the characteristics and properties graphically depicted in FIGS. 4 and 5, will now be described in detail. As seen in FIG. 3A, an n-type epitaxial layer indicated generally at 50 is grown on an n+ substrate of semiconductor material 52. Illustratively, the impurity concentration in the n+ substrate 52 may be in the range of from $5 \times 10^{18}$ to $4 \times 10^{19}$ atoms/cm$^3$, while the impurity concentration in the n-type epitaxial layer 50 may be on the order of from $5 \times 10^{14}$ to $5 \times 10^{16}$ atoms/cm$^3$. The thickness of the epitaxial layer may, by way of illustrative example, be on the order of 0.5 to 7 μm. A 8000 Å layer of low temperature oxide is deposited upon epitaxial layer 50 at a temperature on the order of 420° C. to form an insulating dielectric layer 54.

Figure 3B:
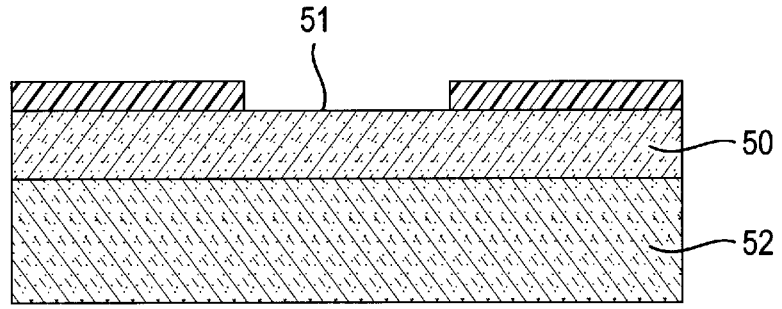
Figure 3C:
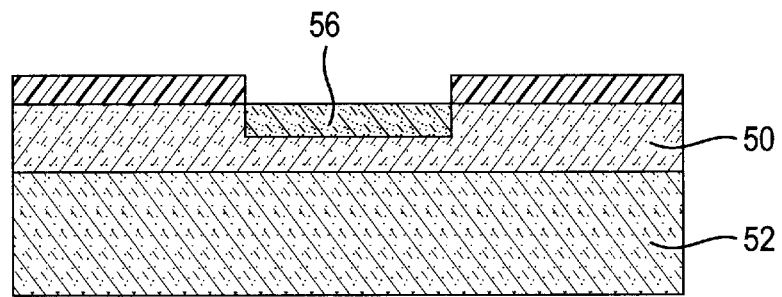

As seen in FIG. 3B, conventional photolithographic techniques are then employed to etch dielectric layer 50 so as to expose the junction area 51 for subsequent processing. A low energy n-type ion implantation may then be performed to form the hyperabrupt region 56. Illustratively, where the epitaxial layer 50 is comprised of silicon, implantation of singly charged phosphorous (P$^+$) is performed (FIG. 3C) at an energy level of approximately 50 keV to a desired depth on the order, for example, of 850 Å. Following thermal activation, which is preferably performed at a temperature of from about 700° C. to about 800° C., the depth of the hyperabrupt region 56 will be from about 1000 to about 1500 Å.

Figure 3D:
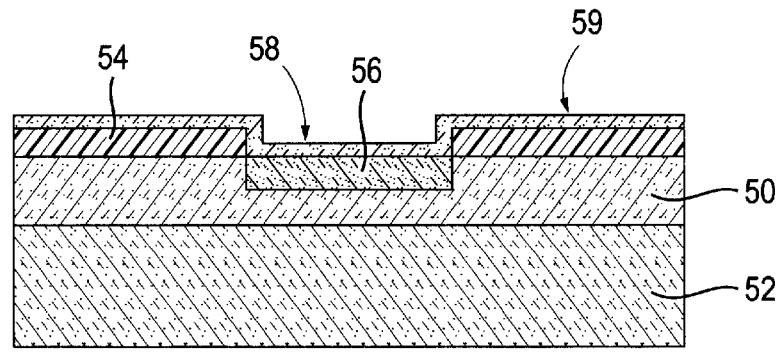
Figure 3E:
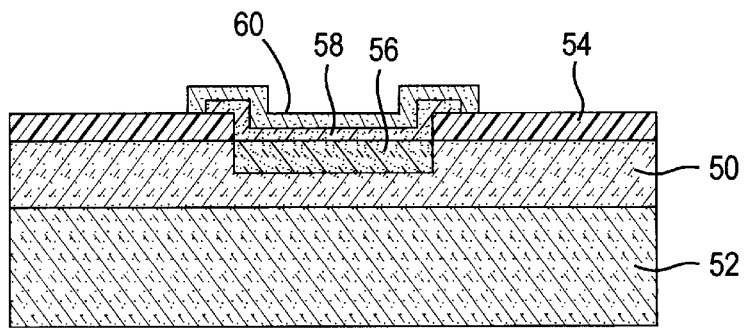
Figure 3F:
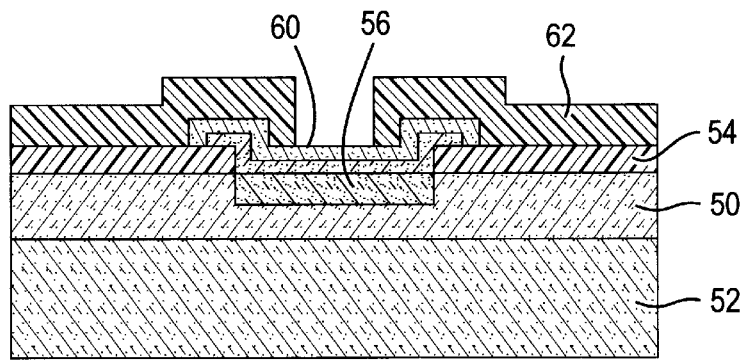
Figure 3G:
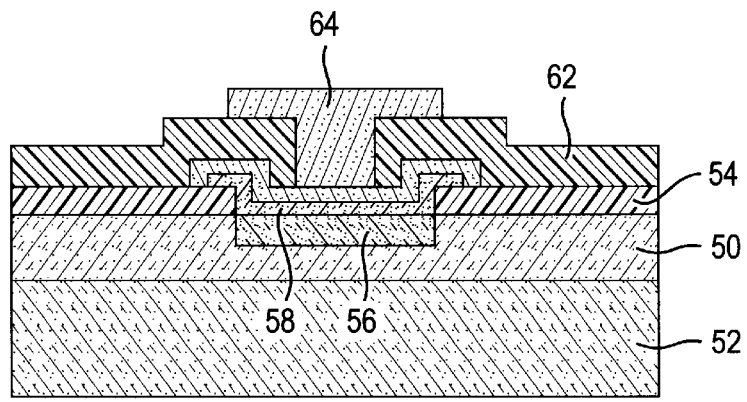

With reference now to FIG. 3D, it will be seen that the fabrication process proceeds to deposition of the heavily doped p+ anode region 58. This region may be on the order of 1500 Å. In accordance with an especially preferred embodiment of the inventive method, the p+ layer of semiconductor material 59 from which anode region 58 is formed by deposition in a UHVCVD process performed at a temperature below 600° C. Using a conventional photolithographic deposition and etching process, the anode region 58 is defined and an ohmic contact 60 of, for example, PtTiPt, is provided thereon (FIG. 3E). Advantageously, the etch removal of portions of the p+ UHVCVD epitaxy from the surface of insulating dielectric layer 54 may be performed using the defined geometry of the PtTiPt ohmic contact layer as an etch mark. As shown in FIG. 3F, a 6000Å dielectric layer 62 of silicon nitride (SiN) is deposited over the structure. A portion of the PtTiPt ohmic contact 60 is exposed by a conventional photolithographic deposition and etch process, whereupon an anode metalization layer 64 of TiPtAu may be deposited and defined photolithographically thereover to obtain the finished structure depicted in FIG. 3G.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

What is claimed is:

1. A method of fabricating a hyperabrupt junction varactor diode, comprising the steps of:

forming a non-uniformly doped n-type, hyperabrupt cathode region in a layer of semiconductor material; and depositing, by ultra high vacuum chemical vapor deposition (UHVCVD), a p-type anode region onto a surface of said hyperabrupt cathode region, said anode region and said hyperabrupt cathode being thereby joined at a junction between them such that an impurity concentration level of said hyperabrupt region increases in a direction toward said junction.

2. The method according to claim 1, wherein said forming step includes a step of implanting n-type impurities at an implantation energy substantially less than 300 keV.

3. The method according to claim 2, wherein said forming step includes a step of implanting n-type impurities at an implantation energy of between from about 10 to 70 keV.

4. The method according to claim 2, wherein said forming step further includes thermally activating impurities implanted during said implanting step, said step of thermally activating being performed at a temperature of between from about 700° C. to about 800° C.

5. The method according to claim 2, wherein one of antimony, arsenic, and phosphorous are implanted during said step of implanting n-type impurities.

6. The method according to claim 1, wherein said depositing step is performed at a temperature sufficiently low as to avoid diffusion of anode material into or through the hyperabrupt cathode region.

7. The method according to claim 6, wherein said depositing step is performed at a temperature below 600° C.

8. The method according to claim 1, wherein a portion of the hyperabrupt region formed during said forming step has an impurity concentration which increases from about $1\times10^{15}$ atoms/cm$^3$ to greater than $1\times10^{17}$ atoms/cm$^3$.

9. The method according to claim 1, wherein a portion of the hyperabrupt region formed during said forming step has an impurity concentration which increases linearly in a direction toward said junction.

10. The method according to claim 1, further comprising a step of epitaxially depositing said layer of semiconductor material on a substrate of n-type semiconductor material prior to said forming step.

11. The method according to claim 6, wherein said forming step comprises implanting n-type impurities at an implantation energy substantially less than 300 keV.

12. The method according to claim 11, wherein said forming step comprises implanting n-type impurities at an implantation energy of between about 10 to about 70 keV.

13. The method according to claim 7, wherein said forming step comprises implanting n-type impurities at an implantation energy substantially less than 300 keV.

14. The method according to claim 13, wherein said forming step comprises implanting n-type impurities at an implantation energy of between from about 10 to 70 keV.

15. The method according to claim 7, wherein a portion of the hyperabrupt region formed during said forming step has an impurity concentration that increases from about $1\times10^{15}$ atoms/cm$^3$ to greater than $1\times10^{17}$ atoms/cm$^3$.

16. A hyperabrupt junction varactor diode, fabricated in accordance with the method of claim 1.

17. The hyperabrupt junction varactor diode according to claim 16 wherein at least a portion of said hyperabrupt region has an impurity concentration which increases from about $1\times10^{15}$ atoms/cm$^3$ to greater than $1\times10^{17}$ atoms/cm$^3$.

18. The junction varactor diode according to claim 17, wherein said hyperabrupt region is formed by a singly charged ion implantation of n-type donor atoms at an energy level lower than 300 keV.

19. The hyperabrupt junction varactor diode according to claim 18, wherein said energy level of implantation of n-type donor atoms is from about 10 to about 70 keV.

20. The hyperabrupt junction varactor diode according to claim 16, wherein said anode is grown at a temperature that is below 600° C.

21. The hyperabrupt junction varactor diode according to claim 16, flirther comprising an ohmic contact on a surface of said anode and a metalization layer on a surface of said ohmic contact.

22. The hyperabrupt junction varactor diode according to claim 16, wherein said anode has an impurity concentration of between about $1\times10^{18}$ and $1\times10^{20}$ atomscm$^3$.

23. The hyperabrupt junction varactor diode according to claim 16, wherein said hyperabrupt region has an impurity concentration of about $5\times10^{14}$ to about $5\times10^{16}$ atoms/cm$^3$ proximate an interface with said hyperabrupt region.

24. The hyperabrupt junction varactor diode according to claim 16, wherein said varactor diode has a tuning ratio greater than 12:1.

25. The hyperabrupt junction varactor diode according to claim 24, wherein said varactor diode has a tuning ratio greater than 15:1.

26. The hyperabrupt junction varactor diode according to claim 19, wherein atoms implanted into said hyperabrupt region are thermally activated at a temperature below 800° C.

27. The hyperabrupt junction varactor diode according to claim 16, wherein said anode is formed by ultra high vacuum chemical vapor deposition at a temperature below 600° C.

* * * * *